United States Patent [19]

Nakasaki

[11] Patent Number: 5,084,412
[45] Date of Patent: Jan. 28, 1992

[54] METHOD OF MANUFACTURING A SEMICONDUCTOR DEVICE WITH A COPPER WIRING LAYER

[75] Inventor: Yasushi Nakasaki, Yokohama, Japan

[73] Assignee: Kabushiki Kaisha Toshiba, Kawasaki, Japan

[21] Appl. No.: 591,374

[22] Filed: Oct. 1, 1990

[30] Foreign Application Priority Data

Oct. 2, 1989 [JP] Japan .................................. 1-255273

[51] Int. Cl.⁵ .......................................... H01L 21/46
[52] U.S. Cl. ...................................... 437/189; 437/191; 437/195; 148/DIG. 35
[58] Field of Search ........................ 437/189, 191, 195; 148/DIG. 35

[56] References Cited

U.S. PATENT DOCUMENTS 4,742,014  5/1988  Hooper et al. ....................... 437/198
4,910,169  3/1990  Hoshino ............................... 437/189

FOREIGN PATENT DOCUMENTS 249127   8/1987  Fed. Rep. of Germany .
02165632 6/1990  Japan .

OTHER PUBLICATIONS

VLSI Multilevel Interconnection Conference (1989), pp. 226-232, K. Hoshino et al., 1989 Proceedings Sixth International IEEE VLSI Multilevel Interconnection Conference.

Primary Examiner—Brian E. Hearn
Assistant Examiner—Laura M. Holtzman
Attorney, Agent, or Firm—Oblon, Spivak, McClelland, Maier & Neustadt

[57] ABSTRACT

According to this invention, there is provided to a semiconductor device comprising a semiconductor substrate on which an element is formed, an insulating interlayer formed on the semiconductor substrate, and a wiring layer having a structure in which a surface of a copper layer in a crystal state is covered with a nitride of a metal not forming an intermetallic compound with copper and the metal and/or the metal nitride is present at grain boundaries of the copper layer.

7 Claims, 5 Drawing Sheets

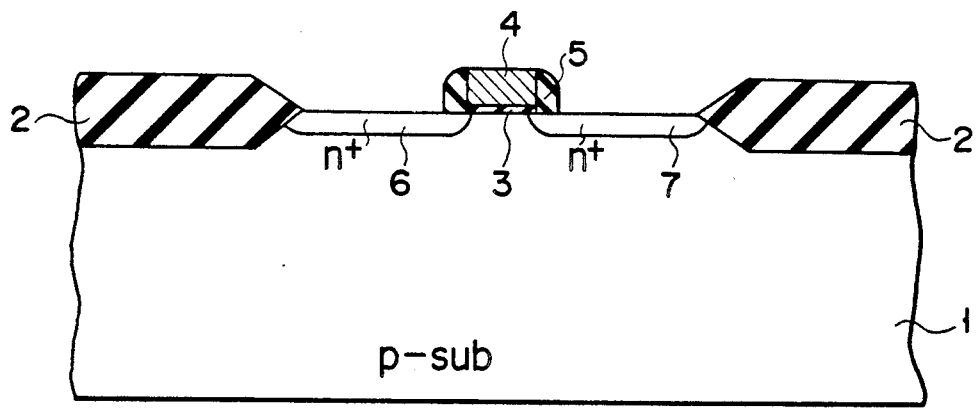
F I G. 2A
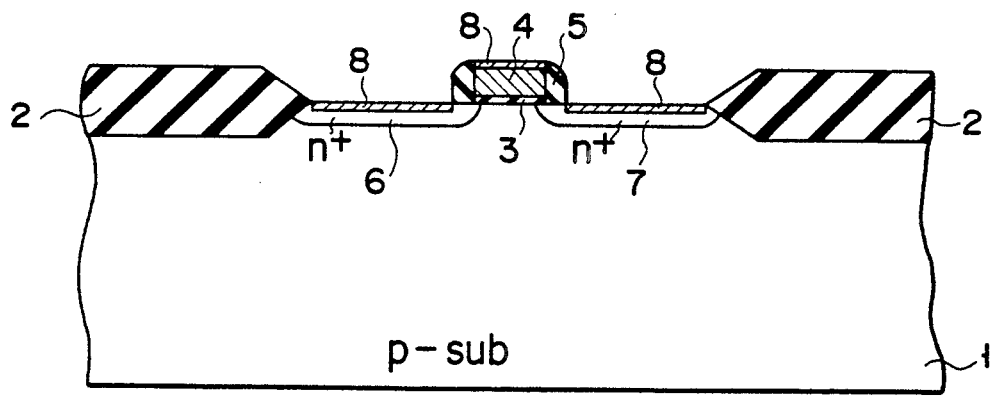
F I G. 2B
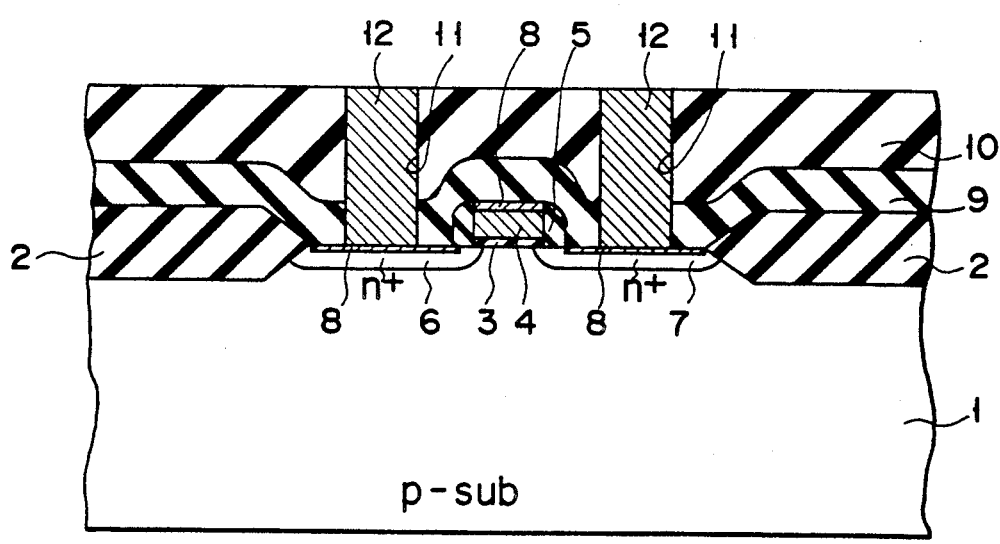
F I G. 2C

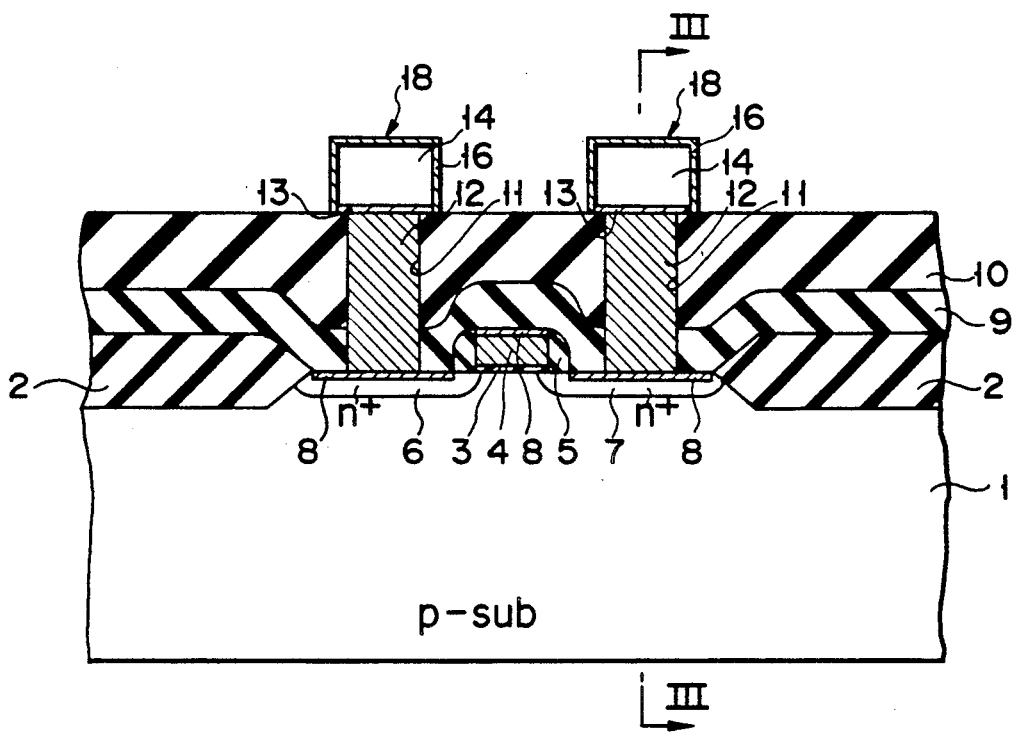
F I G. 2F
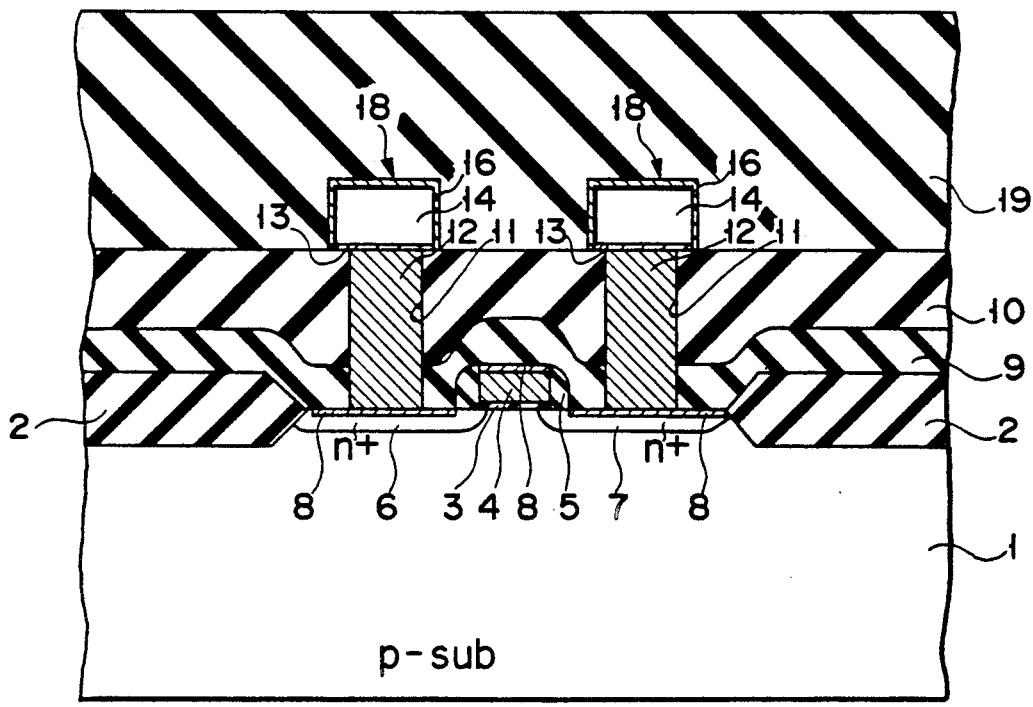
F I G. 2G

METHOD OF MANUFACTURING A SEMICONDUCTOR DEVICE WITH A COPPER WIRING LAYER

BACKGROUND OF THE INVENTION

1. Field of the Invention

The present invention relates to a semiconductor device and a method of manufacturing the same and, more particularly, to a semiconductor device having an improved wiring layer mainly made of copper and a method of manufacturing the same.

2. Description of the Related Art

In recent years, as a semiconductor device is highly integrated, the width and thickness of a wiring layer are decreased, and a multi-layered structure has been developed. As a wiring material, an aluminum alloy having a low specific resistance of 2.75 $\mu\Omega$cm and mainly made of corrosion-resistant aluminum protected from corrosion by a passivation film. However, in the wiring layer made of an aluminum alloy, since a current density is increased in accordance with a decrease in sectional area of the wiring, the wiring layer may be disconnected due to electromigration. In addition, in accordance with an increase the number of wiring layers, complicated thermal hysteresis is applied to the wiring layers, and the wiring layers are disconnected by stress migration due to thermal stress acting on the wiring layers. The above problems are caused by the following reason. Since the melting point of aluminum is low, i.e., a temperature of 660° C., the diffusion of aluminum atoms, especially, atomic diffusion using a grain boundary as a path is accelerated even at a relatively low temperature.

According to the above description, a wiring layer made of copper having a melting point higher than that of aluminum by 400° C. or more has been studied. Using the wiring layer made of copper (pure copper), electromigration disconnection can be suppressed compared with an aluminum-silicon-copper (Al-Si-Cu) alloy. However, it is reported that the service life of the copper wiring layer is improved by only several times or several tens of times compared with the aluminum alloy wiring layer. This service life almost corresponds to a service life estimated by activation energy of grain boundaries diffusion of copper atoms.

Generation of electromigration generally depends on the average crystal grain size and the width of a wiring layer, and the copper wiring layer is not an exception. For example, a copper film having a thickness of about 1 $\mu$m formed by a conventional sputter film forming method has an average crystal grain size of about 1 $\mu$m. In order to form a copper wiring layer having a so-called bamboo structure which has an electromigration resistance, the width of the wiring layer must be 0.5 $\mu$m or less. When the width of the wiring layer is 0.5 $\mu$m or less to improve the electromigration resistance, a practical sectional area of the wiring layer is decreased to increase its resistance. Therefore, signal transmission is delayed, and a high-speed operation is obstructed. In order to increase the sectional area of the wiring layer while keeping the width of the wiring layer to be narrow, the thickness of the wiring layer is increased. However, when the thick wiring layer is formed and covered with an insulating film, a capacitance between the adjacent wiring layers is increased to easily cause crosstalk, thereby obstructing a high-speed operation.

In addition, although an oxide production free energy of copper is slightly decreased, not only the copper is easily oxidized, but a copper oxide film formed on the copper has a low density. For this reason, when the copper wiring layer is exposed in an oxygen atmosphere, even an inner portion of the copper wiring layer is oxidized. For example, in an ashing step of removing a resist film, needle-like copper oxide is produced from the surface of the copper wiring layer, the shape of the wiring layer is degraded, and the resistance thereof is increased. In addition, in steps of depositing a passivation film and an insulating interlayer on the copper wiring layer, an adhesion strength between the wiring layer and the insulating interlayer or a passivation film is degraded due to the presence of the needle-like copper oxide to remove the films.

K. Hoshino et al. read a method of forming an improved copper wiring layer in the VMIC Conference, p226 to p232, June 12-3 1989. According to this method, an oxide film having a thickness of about 0.4 $\mu$m is formed on the surface of a silicon substrate, and a tungsten layer serving as an adhesion layer and a TiN layer serving as a barrier layer are sequentially deposited on the oxide film. A Cu-Ti alloy thin film is deposited on the TiN layer by sputter evapolation using a target made of copper and titanium. After the thin film is patterned, the thin film is heat-treated in a nitrogen atmosphere. In this heat treatment (nitriding) step, Ti contained in the Cu-Ti alloy thin film pattern is diffused in the surface thereof, and the diffused Ti is nitrided to form a titanium nitride layer. As a result, the wiring layer, the peripheral surface of which is covered with the titanium nitride layer having good oxide resistance and which is made of copper including almost no Ti, is formed.

However, in the above method, as is apparent from FIG. 1 showing a relationship between a temperature of nitriding the Cu-Ti alloy thin film pattern and a specific resistance of the wiring layer, in order to obtain a wiring layer having a specific resistance of 2.5 $\mu\Omega$cm less than the specific resistance (3 $\mu\Omega$cm) of the Al-Si-Cu alloy, heat treatment must be performed at a temperature of 800° C. As is described in the above literature, when nitriding is performed at a temperature of less than 800° C., Ti is not diffused from the Cu-Ti alloy thin film, and not only a titanium nitrid layer is not formed on the surface of the wiring layer but a wiring layer having a low specific resistance almost equal to the specific resistance of copper and containing almost no Ti cannot be formed. Since the above nitriding must be performed at a relatively high temperature, an impurity diffusion layer formed on the silicon substrate in advance is subjected to diffusion again. Therefore, shallowing of diffusion layer is obstructed, and the number of electrically activated carrier is decreased.

SUMMARY OF THE INVENTION

It is an object of the present invention to provide a semiconductor device including a wiring layer having a specific resistance lower than the specific resistance (3 $\mu\Omega$cm) of an Al-Si-Cu alloy.

It is another object of the present invention to provide a high-speed semiconductor device including a wiring layer having an excellent electromigration resistance even when the wiring layer is wide and has no bamboo structure in relation to an average grain size.

It is still another object of the present invention to provide a semiconductor device including a wiring layer which is excellent in oxidation resistance and adhesion and which can be prevented from peeling from a passivation film or an insulating interlayer upon formation of the passivation film or the insulating interlayer.

It is still another object of the present invention to provide a method of manufacturing a semiconductor device wherein the wiring layer can be formed at a low temperature, e.g., 800° C. or less.

According to the present invention, there is provided to a semiconductor device comprising:

a semiconductor substrate on which an element is formed;

an insulating interlayer formed on the semiconductor substrate; and a wiring layer formed on the insulating interlayer and having a structure in which a surface of a copper layer in a crystal state is covered with a nitride of a metal not forming an intermetallic compound with copper, and the metal and/or the metal nitride is present at grain boundaries of the copper layer.

According to the present invention, there is provided to a method of manufacturing a semiconductor device, comprising the steps of:

forming an element on a semiconductor substrate;

depositing an insulating interlayer on the semiconductor substrate;

sequentially depositing a thin layer made of a metal not forming an intermetallic compound with copper and a copper layer on the insulating interlayer to form a stacked layer;

patterning the stacked layer;

forming a wiring layer having a structure in which the patterned stacked layer is heat-treated in a nitrogen atmosphere to diffuse a metal of the metal thin layer to a peripheral surface of a copper layer through the copper layer, the diffused metal is nitrided to cover a surface of the copper layer in a crystal state with a nitride of a metal not forming an intermetallic compound with copper, and the metal and/or the metal nitride is present at grain boundaries of the copper layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawing, which is incorporated in and constitutes a part of the specification, illustrates presently preferred embodiments of the invention and, together with the general description give above and the detailed description of the preferred embodiments given below, serves to explain the principles of the invention.

FIGS. 2A to 2G are sectional views showing steps in manufacturing a semiconductor device according to Example 1;

DETAILED DESCRIPTION OF THE INVENTION

Figure 1:
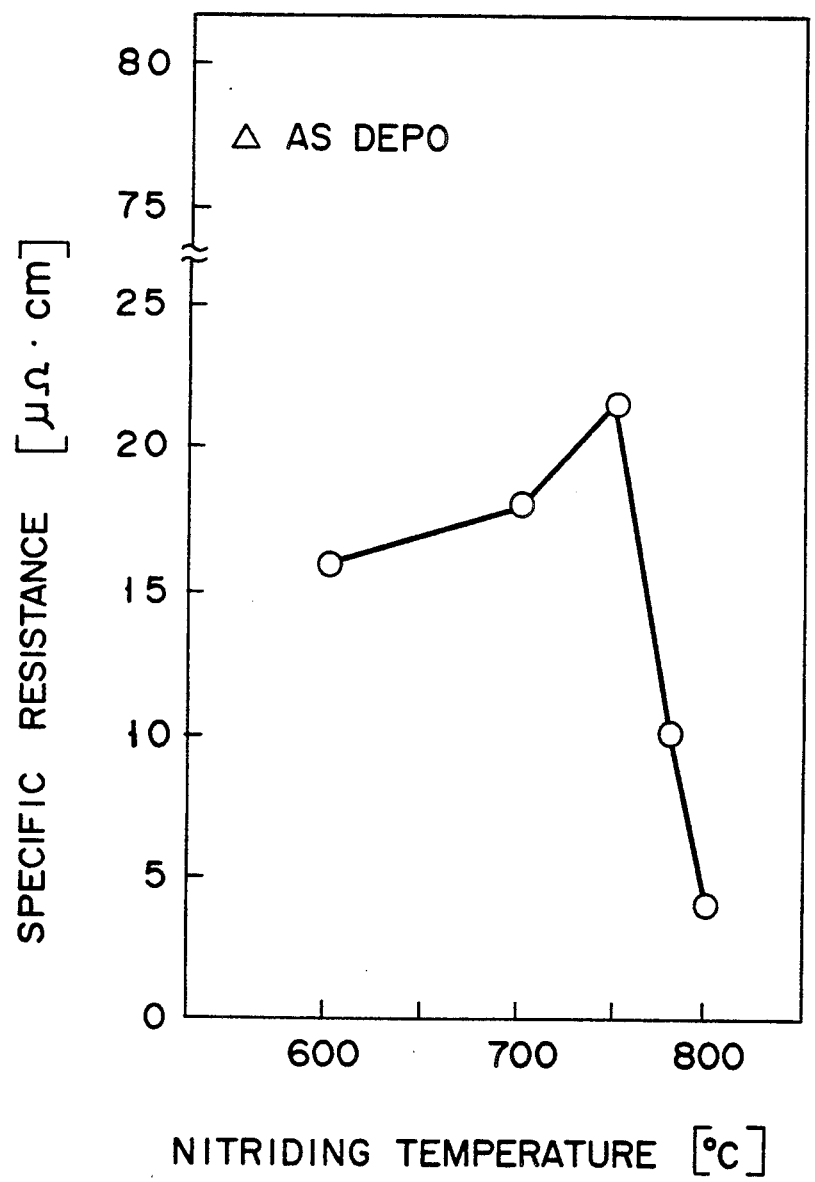
FIG. 1 is a graph showing the relationship between an annealing temperature of a Cu-Ti alloy thin layer pattern in a nitrogen atmosphere and the specific resistance of the conventional wiring layer formed by thin nitriding.

According to the present invention, there is provided to a semiconductor device comprising a semiconductor substrate on which an element is formed, an insulating interlayer formed on the semiconductor substrate, a wiring layer formed on the insulating interlayer and having a structure in which a copper layer surface in a crystal state is covered with a nitride of a metal not forming an intermetallic compound with copper and the metal and/or the metal nitride is present at grain boundaries of the copper layer.

As the semiconductor substrate, for example, a p-type silicon substrate, an n-type silicon substrate, and a silicon substrate of one conductivity type (e.g., p-type) on which n-type and p-type regions are two-dimensionally formed are used. As the semiconductor substrate, another semiconductor such as Ge, GaAs, InP, an SOS wafer obtained by forming a semiconductor layer on an insulating substrate, or an SOI wafer obtained by sequentially forming an insulating layer and semiconductor layer on a silicon substrate may be used.

As the insulating interlayer, e.g., a CVD-SiO$_2$ single layer, or a two-layered film obtained by stacking glass film such as a phosphosilicate glass (PSG) film, a borosilicate glass (BSG), or a borophosphosilicate glass (BPSG) film on the CVD-SiO$_2$ film can be used. Using the two-layered film as the insulating interlayer, the BPSG film or the like on the upper surface is reflowed to prevent transfer of the step difference on the surface of the insulating interlayer to form an insulating interlayer having a flat surface.

As a metal not forming an intermetallic compound with copper, at least any one metal is selected from the group consisting of vanadium, niobium, tantalum, chromium, molybdenum, and tungsten.

The thickness of the wiring layer is preferably 0.1 to 0.9 μm because of the following reason. As a grain size of copper layer constituting the wiring layer becomes large, electromigration resistance is improved. Therefore, when the thickness of the wiring layer is less than 0.1 μm, the grain size is limited by the thickness, and the electromigration resistance may not be improved. Contrast to this, when the thickness of the wiring layer exceeds 0.9 μm, a capacitance between adjacent wiring layers is increased to cause a signal transmission delay due to crosstalk. As a wiring layer for an LSI, reliability is degraded.

A thin layer made of a metal not forming an intermetallic compound with the copper can be formed between the insulating interlayer and the wiring layer The metal thin layer effectively contributes to improvement of adhesion strength of the wiring layer on the insulating interlayer. The metal thin layer is preferably 30% or less of the thickness of the wiring layer, because of the following reason. Since the metal thin layer serves as a part of the wiring layer and as a resistance component, when the thickness exceeds 30% of the thickness of the wiring layer, a total resistance including that of the wiring layer and a metal thin layer may be increased.

In addition, a method of manufacturing a semiconductor device according to the present invention comprises the steps of forming an element on a semiconductor substrate, depositing an insulating interlayer on the semiconductor substrate, sequentially depositing a thin layer made of metal not forming intermetallic compound with copper and a copper layer on the insulating interlayer to form a stacked layer, patterning the stacked layer, forming a wiring layer having a structure in which the patterned stacked layer is heat-treated in a nitrogen atmosphere to diffuse a metal of the metal thin layer to a peripheral surface of a copper layer through the copper layer, the diffused metal is nitrided to cover a copper surface in a crystal state with a nitride of a metal not forming an intermetallic compound with copper and the metal and/or the metal nitride is present at grain boundaries of the copper layer.

The average grain size of the copper layer is desired to have a thickness of 0.3 μm or more. The thickness of the copper layer is desired to fall within a range of 0.1 to 0.8 μm such that a final wiring layer has the above thickness.

The thickness of the metal thin layer is desired to fall within a range of a thickness which can form a monlayer of the copper atom to 30% of the thickness of the copper layer. The metal thin layer may be entirely diffused through the copper layer in the above heat treatment in the nitrogen atmosphere, or the metal thin layer may be partially diffused to leave part of the metal thin layer.

As the nitrogen atmosphere, a gas containing at least nitrogen gas may be used. Especially, a gas containing only nitrogen gas, a gas mixture of nitrogen and hydrogen gases, or a gas mixture of nitrogen and inert gases is desirably used.

As the heat treatment in the nitrogen atmosphere, for example, a heat treatment in a furnace filled with nitrogen gas or plasma nitriding can be used.

According to the heat treatment in the nitrogen atmosphere, a metal of the metal thin layer must be diffused on a peripheral surface of the copper layer through the copper layer, and the metal diffused in the surface must be set at a nitriding temperature. In practice, when a niobium thin layer is used, a heat treatment is desired to be performed at a temperature falling within a range of 600 to 800° C.; a chromium thin layer, a temperature of 600 to 800° C.; a vanadium thin layer, a temperature of 500 to 800° C.; a tantalum thin layer, a temperature of 550 to 800° C.; a molybdenum thin layer, a temperature of 700 to 800° C.; and tungsten thin layer, a temperature of 700 to 800° C. Note that, when plasma nitriding is employed as a heat treatment in the nitrogen atmosphere, the heat treatment can be performed at a temperature lower than the above temperatures.

According to the heat treatment in the nitrogen atmosphere, the grain size of the copper layer can be controlled. For example, when a heating rate is increased, the grain size of the copper layer is increased compared with not only a grain size during deposition but also the grain size in the heat treatment at a lower rate of elevating temperature. As a means for controlling the grain size of the copper layer, a heat treatment is performed in an inert atmosphere prior to the heat treatment in the nitrogen atmosphere. As a gas containing an inert gas, a gas containing only an inert gas such as argon or helium gas or a gas mixture of the inert gases and hydrogen gas is used. As the heat treatment, for example, rapid annealing using heat from an infrared lamp can be employed. Especially, when the rapid annealing is employed, the grain size of the copper layer can be further increased compared with the method of controlling a rate of an increase in temperature.

According to the present invention described above, since a wiring layer has a structure in which an insulating interlayer of a semiconductor substrate is covered with a nitride of a metal not forming an intermetallic compound with copper on a copper layer surface in a crystal state and the metal and/or the metal nitride is present at the grain boundaries of the copper layer, oxidation of the wiring layer is prevented by the metal nitride covering the wiring layer to obtain an original low specific resistance of copper, and a high adhesion strength between the wiring layer and the insulating interlayer o passivation film deposited on the wiring layer. In addition even when the wiring layer is wide not to have bamboo structure in relation to an average crystal grain size, electromigration resistance can be improved by the nitride which is present at the grain boundaries of copper layer. For this reason, the wiring layer can be formed to be wide, and a signal propagation speed can be increased by the reduction in the above specific resistance. In addition, when a metal thin layer made of a metal not forming intermetallic compound with copper is formed between the insulating interlayer and the wiring layer, the adhesion strength of the wiring layer on the insulating interlayer can be improved.

Therefore, a highly reliable high-speed semiconductor device having wiring layer in which disconnection is suppressed and which has a high adhesion strength with an insulating interlayer or passivation film and an extremely low specific resistance can be obtained.

According to the method of the present invention, a thin layer made of a metal not forming an intermetallic compound with copper and a copper layer are sequentially deposited on an insulating interlayer of a semiconductor substrate, and the stacked layer is patterned and then heat-treated in a nitrogen atmosphere. In the heat treatment, a metal is diffused on a peripheral surface of the copper layer from the metal thin film through the copper layer thereabove, and the diffused metal is nitrided to cover the copper layer. This nitride is also formed at grain boundaries of the copper layer. As a result, a wiring layer having a structure in which the copper layer surface in a crystal state is covered with a nitride of a metal not forming an intermetallic compound with copper and the metal and/or the metal nitride is present at the grain boundaries of the copper layer can be formed on the insulating interlayer. Since the heat treatment can be performed at a temperature within a range sufficiently lower than 800° C. (e.g., 450 to 600° C.), the above electromigration can be suppressed such that an impurity diffusion layer formed on the semiconductor substrate in advance is not diffused deeper again. Therefore, a highly reliable high-speed semiconductor device having a low specific resistance wiring layer and suitable for shallowing diffusion layer can be easily manufactured.

Upon a heat treatment in a nitrogen atmosphere, a heating rate is increased, or a heat treatment is performed in an inert atmosphere prior to the above heat treatment to increase the grain size of the copper film. Therefore, a wiring layer having further lower resistivity and further improved electromigration resistance can be formed on the insulating interlayer.

DETAILED DESCRIPTION OF THE PREFERRED EMBODIMENTS

The present invention will be described below by way of its examples with reference to the accompanying drawings.

EXAMPLE 1

As shown in FIG. 2A, a p-type silicon substrate 1 was selectively oxidized to form a field oxide film 2 having a thickness of, e.g., 0.5 μm. Thermal oxidation was performed to form a thermal oxide film on the surface of the island-like silicon substrate 1 isolated by the field oxide film 2. After an arsenic-doped polysilicon film having a thickness of 0.2 μm was deposited, the silicon film and thermal oxide film were patterned to form a gate oxide film 3 and a gate electrode 4 on the surface of the substrate 1. After an SiO₂ film having a thickness of about 0.25 μm was deposited on the entire surface of the substrate by a CVD method, reactive ion etching was performed to leave an SiO₂ film 5 on the peripheral side surface of the gate oxide film 3 and the gate electrode 4 in a side-wall-like shape. Thereafter, an n-type impurity (e.g., arsenic) was ion-implanted in the silicon substrate using the field oxide film 2, the gate electrode 4, and the SiO₂ film 5 as masks, and activation was performed to form $n^+$-type source and drain regions 6 and 7 each having a junction depth of, e.g., 0.15 μm.

After a titanium thin layer having a thickness of 0.08 μm was deposited on the entire surface of the substrate by sputtering, as shown in FIG. 2B, a titanium thin layer contacting the source region 6, a drain region 7, and the gate electrode 4 of the silicon substrate was exposed by performing a heat treatment at a temperature of 750° C. for 30 minutes, in a nitrogen atmosphere was silicidized to form a titanium silicide layer 8 as a buffer layer, and the titanium thin layers on the field oxide film 2 and the SiO₂ film 5 were removed. Thereafter, annealing was performed in a nitrogen atmosphere at a temperature of 900° C. for 20 minutes. Note that a nickel thin layer may be deposited in place of the titanium thin layer, and a nickel silicide layer may be formed on the surfaces of the source region 6, the drain region 7, and the gate electrode 4 exposed by applying the same heat treatment as described above.

As shown in FIG. 2C, after an SiO₂ film 9 having a thickness of 0.3 μm and a BPSG film 10 having a thickness of 0.7 μm serving as insulating interlayers were sequentially deposited on the entire surface of the substrate by a CVD method, a heat treatment was performed to reflow the BPSG film 10, thereby flattening the surface of the film 10. The SiO₂ film 9 and the BPSG film 10 respectively corresponding to a part of the source region 6 and a part of the drain region 7 were selectively removed by etching to form square contact holes 11 each having a side of 0.5 μm, and then tungsten was selectively deposited in the contact holes 11 to bury tungsten plugs 12 in the contact holes 11.

Figure 2D:
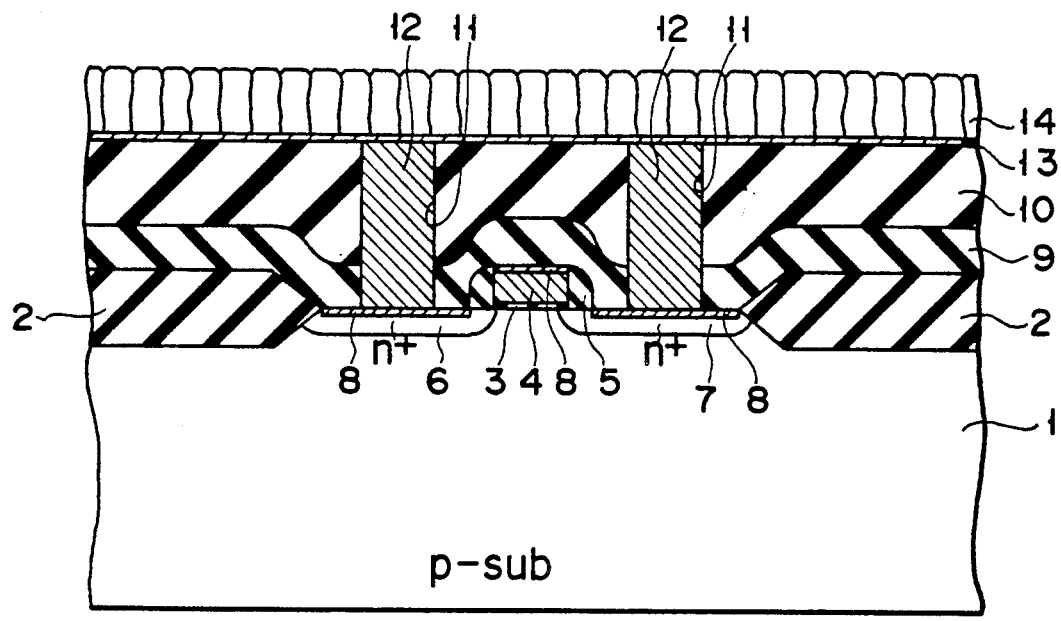
Figure 2E:
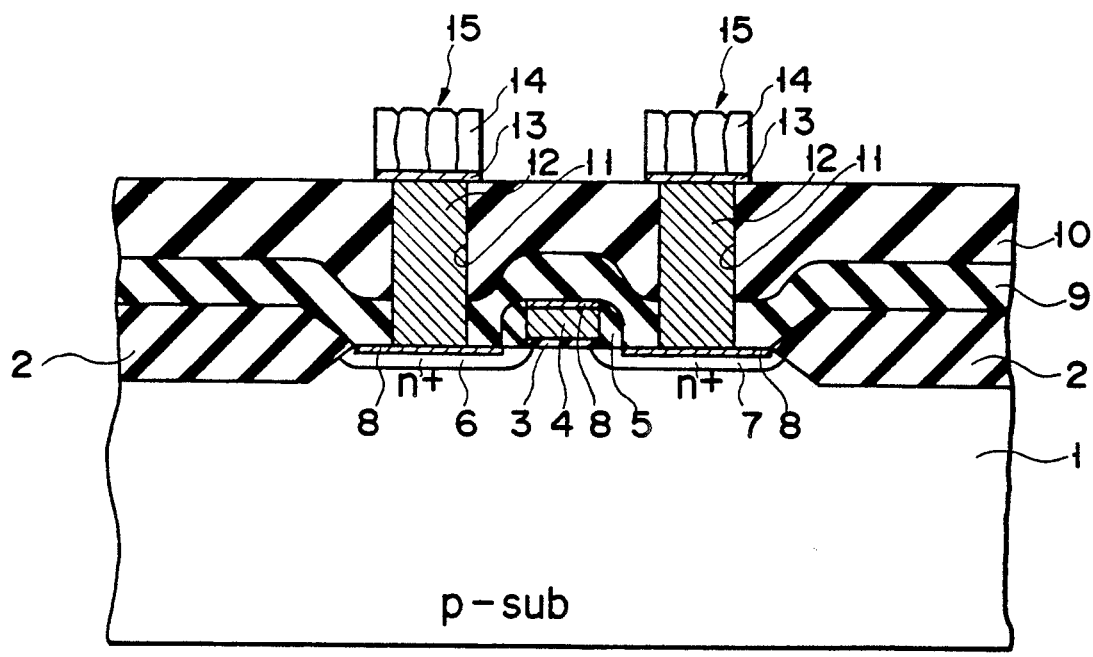

The silicon substrate was set in a chamber of a magnetron sputtering apparatus, and after the chamber was evacuated to have a pressure of $2.0 \times 10^{-5}$ Pa or less, an argon gas was supplied to the chamber at a flow rate of 40 cm³/min. At this time, the pressure in the chamber was kept to be $3.7 \times 10^{-1}$ Pa. While the silicon substrate was rotating, a chromium (Cr) target was sputtered by an argon plasma to deposit a chromium thin layer 13 having a thickness of 0.05 μm on the BPSG film 10, as shown in FIG. 2D. In an argon plasma atmosphere generated with an applied voltage of 600 V and a target current of 5A, while the silicon substrate was rotated, copper (Cu) target was sputtered to deposit a copper layer 14 having a thickness of 0.4 μm on the chromium thin layer 13. The deposited copper layer 14 consisted of grains having an average grain size of 0.2 μm. The sheet resistance of the stacked layer constituted by the chromium thin layer 13 and the copper layer 14 was 55 mΩ/□. Thereafter, the stacked layer was patterned using a reactive ion etching method to form a chromium-copper stacked layer pattern 15 on the BPSG film 10 including the tungsten plugs 12, as shown in FIG. 2E.

Figure 3:
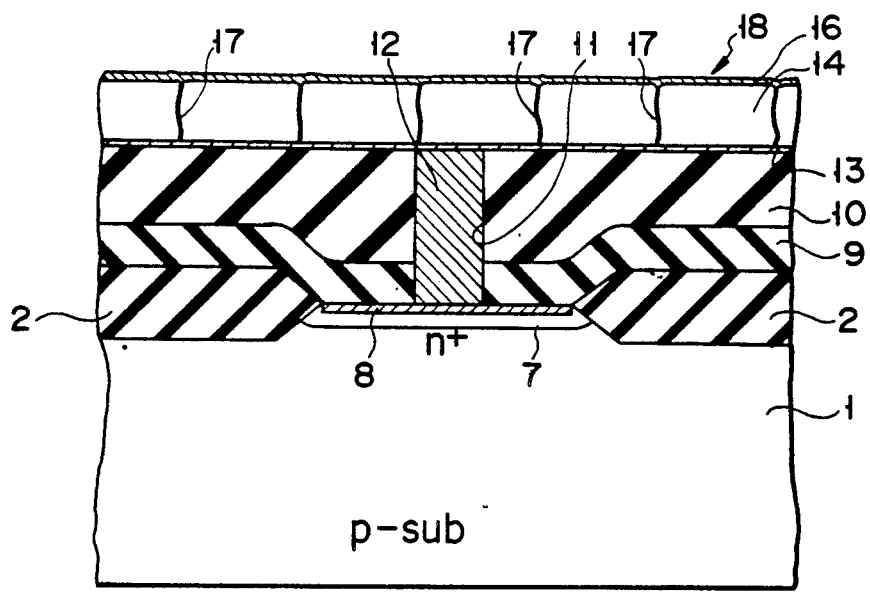
FIG. 3 is a sectional view showing the semiconductor device taken along a line III—III in FIG. 2F.

After the silicon substrate 1 on which the stacked layer pattern 15 was formed was set in an infrared image furnace, the furnace was evacuated to a pressure of $1.3 \times 10^{-4}$ Pa. A gas mixture of hydrogen and nitrogen gases (a volume ratio of $H_2 : N_2 = 10 : 90$) was supplied in the furnace at a pressure of 1 atm. and a rate of 3,000 cm³/min. The furnace was heated to 650° C. at a heating rate 50° C./min, and the temperature was kept for 30 minutes. Thereafter, the furnace was cooled at a cooling rate of 50° C./min. The grain size of the copper layer 14 was increased to 0.7 μm by a heat treatment in a nitrogen atmosphere. Chromium of the chromium thin layer 13 was diffused to the peripheral surface of the copper layer 14 through crystal grain boundaries of the copper layer 14, and the diffused chromium was nitrided to form a chromium nitride ($Cr_2N$ or $CrN$) layer. At the same time, the chromium diffusing through grain boundaries of the copper layer 14 was nitrided. As a result, as shown in FIGS. 2F and 3, a wiring layer 18 constituted by the copper layer 14 was formed on the remaining chromium thin layer 13. The peripheral surface of the layer 14 was covered with a chromium nitride layer 16 having a thickness of 0.03 μm, and the layer 14 contain chromium nitride 17 at the grain boundaries, the grains having a diameter of 0.7 μm. Thereafter, as shown in FIG. 2G, a passivation film 19 made of plasma CVD-SiO₂ having a thickness of 1.8 μm was deposited on the resultant structure, thereby manufacturing a MOS semiconductor device.

Since the surface of the wiring layer 18 of a semiconductor device manufactured by the above method was covered with the chromium nitride layer 16, the surface of the wiring layer 18 was prevented from oxidation in a step of depositing the passivation film 19, and the passivation film 19 tightly contacted o the wiring layer 18. In addition, since the chromium thin layer 13 was left under the wiring layer 18, the wiring layer 18 tightly contacted on the BPSG film 10 serving as an insulating interlayer.

An acceleration test for supplying a current of $1 \times 10^7$ A/cm² to the wiring layer 18 was performed to the manufactured semiconductor device at a temperature of 250° C., and a disconnection time of the wiring layer 18 due to electromigration was measured. As a result, after about 100 hours from when the acceleration test was started, disconnections were detected in 50% of the wiring layer 18. Therefore, it was confirmed that the semiconductor device had excellent electromigration resistance. Note that, when the same acceleration test as described above was performed to a wiring layer made of pure copper and having the same size as in Example 1, after about 10 hours from when the acceleration test was started, disconnections were detected in 50% of the wiring layer. As described above, the wiring layer 18 formed in Example 1 had an excellent electromigration resistance, because grain size of copper layer was increased to 0.7 μm and chromium nitride was present at boundaries of crystal grains.

When the total resistance of the remaining chromium thin layer 13 and the wiring layer 18 was measured, the resistance was 48 mΩ/□. It was confirmed that the resistance could be reduced compared with the resistance (55 mΩ/□) of the stacked layer pattern 15 which was not heat-treated. That is, when the resistance was converted into a specific resistance, the specific resistance could be reduced from 2.2 μΩcm to 1.9 μΩcm.

EXAMPLE 2

The heat treatment performed at temperatures of 450° C., 550° C., and 750° C. in place of at a temperature of 650° C. in Example 1, and the total specific resistance of the chromium thin layer and the wiring layer was measured at the above temperature conditions. A result shown in FIG. 4 could be obtained.

Figure 4:
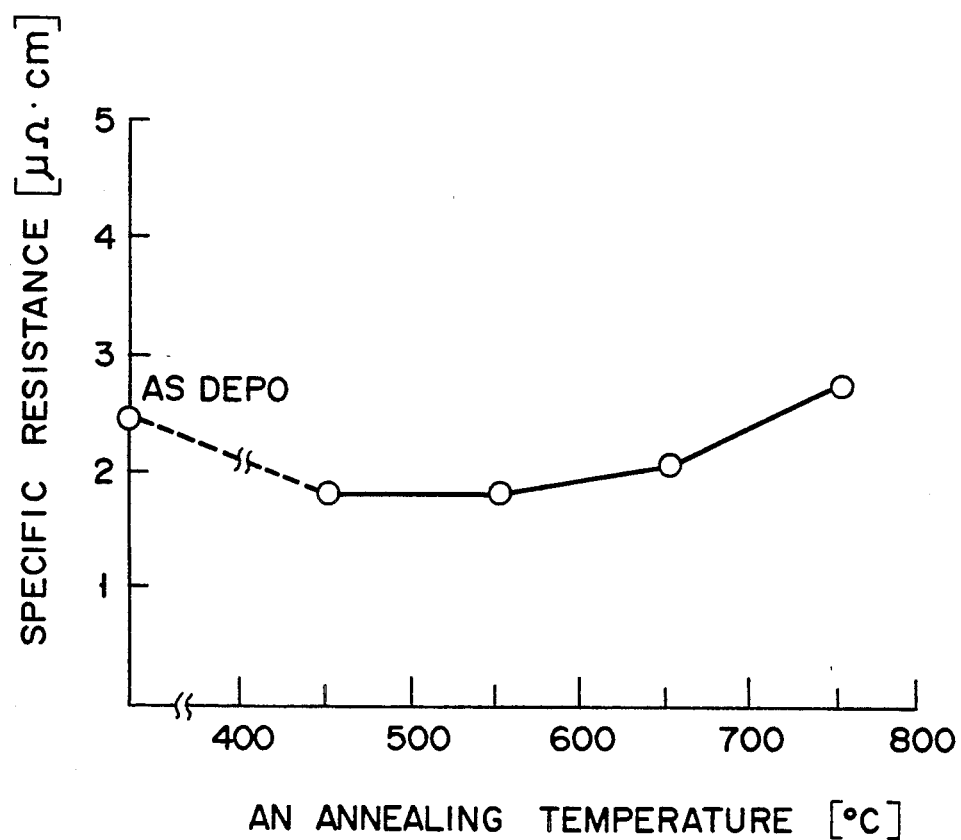
FIG. 4 is a graph showing a relationship between an annealing temperature in a nitrogen atmosphere and a specific resistance of a wiring layer according to Example 2.

As shown in FIG. 4, it is known that a low specific resistance of the wiring layer can be obtained at a temperature sufficiently lower than a temperature for decreasing the number of electrically activated carrier of source and drain regions 6 and 7 formed on a silicon substrate 1 in advance.

EXAMPLE 3

Following the same procedures as in Example 1, a gate oxide film, a gate electrode, an n+-type source region, a drain region, and a titanium silicide layer were formed on a p-type silicon substrate, and $SiO_2$ and BPSG films serving as an insulating interlayer are deposited. In addition, a contact hole was formed, and a tungsten plug was buried in the contact hole. A chromium layer having a thickness of 0.05 μm and a copper layer having a thickness of 0.4 μm were deposited on the BPSG film by sputtering, and a stacked layer constituted by the copper layer and the chromium thin layer was patterned to form a chromium-copper stacked layer pattern.

After the silicon substrate on which the stacked layer pattern was formed was set in a resistive heating furnace for performing a plasma treatment, the furnace was evacuated to a pressure of $1.3 \times 10^{-4}$ Pa. After a gas mixture of hydrogen and nitrogen (a volume ratio of $H_2$ : $N_2$ = 10 : 90) was supplied in the furnace at a pressure of 330 Pa and a flow rate of 500 cm$^3$/min, the temperature of the furnace was increased to be 550° C. at a heating rate of 50° C./min. At the same time, a 13.56 MHz high-frequency power of 800 W was applied to electrodes arranged on both sides of the silicon substrate in the heating furnace to generate a nitrogen plasma by RF discharge, and the silicon substrate was held in a nitrogen plasma atmosphere at a temperature of 550° C. for 45 minutes. Thereafter, the RF discharge was stopped, and the silicon substrate was cooled at a cooling rate of 50° C./min.

With the above heat treatment, as in Example 1, a wiring layer constituted by a copper layer was formed on the remaining chromium thin layer. The preferal surface of the copper layer was covered with a chromium nitride layer having a thickness of 0.03 μm, and the copper layer contained chromium and/or chromium nitride at the grain boundaries, the crystal grains having a diameter of 0.7 μm. When the resistance of the wiring layer (including the cromium thin layer) was measured, the resistance was 48 Ωm/□. It was confirmed that the resistance could be largely reduced compared with the resistance (55 mΩ/□) of the stacked layer pattern which was not heat-treated. That is, when the resistance was converted into a specific resistance, the specific resistance was reduced to be 1.9 μΩcm compared with the specific resistance of 2.2 μΩm before the heat treatment.

EXAMPLE 4

Following the same procedures as Example 1, a gate oxide film, a gate electrode, an n+-type source region, a drain region, a titanium silicide layer were formed on a p-type silicon substrate, and $SiO_2$ and BPSG films serving as an insulating interlayer were deposited on the resultant structure. In addition, a contact hole was formed in the resultant structure, and a tungsten plug was buried in the contact hole. A chromium thin layer having a thickness of 0.05 μm and a copper layer having a thickness of 0.4 μm were deposited on the BPSG film by sputtering, and a stacked layer constituted by the copper and the chromium thin layer was patterned to form a chromium-copper stacked layer pattern.

After the silicon substrate on which the stacked layer pattern was formed was set in an infrared lamp heating furnace for performing a plasma treatment, the furnace was evacuated at a pressure of $1.3 \times 10^{-4}$ Pa. After a gas mixture of hydrogen and argon (a volume ratio of $H_2$ : Ar = 10 : 90) was supplied in the furnace at a pressure of 1 atm. and a flow rate of 10 cm$^3$/min, the temperature of the furnace was increased to 700° C. at a heating rate of 100° C./sec by lamp heating, and this temperature was kept for 15 minutes. Thereafter, the temperature was decreased to 550° C. at a cooling rate of 100° C./sec. At the same time, an average grain size was increased from 0.2 μm to 1.5 μm.

The gas in the heating furnace was exhausted, and the pressure of the furnace was set to be $1.3 \times 10^{-4}$ Pa. Thereafter, while a gas mixture of hydrogen and nitrogen (a volume ratio of $H_2$ : $N_2$ = 10 : 90) was supplied in the furnace at a flow rate of 500 cm$^3$/min and at a pressure of 1 atm, a 13.56 MHz high-frequency power of 800 W was applied to electrodes arranged on both sides of the silicon substrate to generate a nitrogen plasma by RF discharge, and the silicon substrate was held in a nitrogen plasma atmosphere at a temperature of 550° C. for 45 minutes. Thereafter, the RF discharge was stopped, and the silicon substrate was cooled at a cooling rate of 50° C./min.

With the above two-step heat treatment, a wiring layer constituted by the copper layer was formed on the remaining chromium thin layer. The peripheral surface of the copper layer was covered with a chromium nitride layer having a thickness of 0.03 μm, and the copper layer contained chromium and/or chromium nitride at the grain boundaries, the grains having a diameter of 1.5 μm. When the resistance of the wiring layer (including a remaining chromium thin layer) was measured, the resistance was 45 mΩ/□. It was confirmed that the resistance of the wiring layer could be largely reduced compared with the resistance (55 mΩ/□) of the stacked layer pattern which was not thermally treated. That is, when the resistance was converted into a specific resistance, the specific resistance could be reduced from 2.2 μΩcm to 1.8 μΩcm. In addition, since an average grain size of copper of the wiring layer was increased to be 1.5 μm, electromigration resistance was further improved to obtain the highly reliable wiring layer.

EXAMPLE 5

Following the same procedures as Example 1, a gate oxide film, a gate electrode, an n+-type source region, a drain region, a titanium silicide layer were formed on a p-type silicon substrate, and SiO$_2$ and BPSG films serving as an insulating interlayer were deposited on the resultant structure. In addition, a contact hole was formed in the resultant structure, and a tungsten plug was buried in the contact hole. The silicon substrate was set in a chamber of a magnetron sputtering apparatus, and the chamber was evacuated to have a pressure of $2.0 \times 10^{-5}$ Pa. An argon gas was supplied to the chamber at a rate of 40 cm$^3$/min. At this time, the chamber was kept at a pressure of $3.7 \times 10^{-1}$ Pa. While the silicon substrate was rotated, a niobium (Nb) target was sputtered to the substrate to deposit a niobium thin layer having a thickness of 0.05 μm on the BPSG film by an argon plasma. Subsequently, while the silicon substrate was continuously rotated, a copper (Cu) target was sputtered in the same condition as in Example 1 to deposit a copper layer having a thickness of 0.4 μm on the niobium thin layer. The deposited copper layer consisted of grains having an average grain size of 0.2 μm. The resistance of the niobium and copper stacked layer was 55 mΩ/□. Thereafter, the stacked layer constituted by the copper layer and the niobium thin layer was patterned to form a niobium-copper stacked layer pattern having a width of 0.7 μm.

After the silicon substrate on which the stacked layer pattern was formed was set in an infrared image furnace, the furnace was evacuated to a pressure of $1.3 \times 10^{-4}$ Pa. A gas mixture of hydrogen and nitrogen gases (a volume ratio of H$_2$ : N$_2$ = 10 : 90) was supplied in the furnace at a pressure of 1 atm. and a rate of 3,000 cm$^3$/min. The furnace was heated to have a temperature of 650° C. at a heating rate of 50° C./min, and temperature was kept for 30 minutes. Thereafter, the furnace was cooled at a cooling rate of 50° C./min. The grain size of the copper layer was increased to 0.7 μm by a heat treatment in a nitrogen atmosphere. Niobium of the niobium thin layer was diffused to the peripheral surface of the copper layer through crystal grain boundaries of the copper layer, and the diffused niobium was nitrided to form a niobium nitride (Nb$_2$N or NbN) layer. At the same time, the niobium diffusing through grain boundaries of the copper layer was nitrided. As a result, a wiring layer constituted by the copper layer was formed on the remaining niobium thin layer. The peripheral surface of the copper layer was covered with a niobium nitride layer having a thickness of 0.03 μm, and the copper film contained niobium and/or niobium nitride at the grain boundaries, the grains having a diameter of 0.7 μm. Thereafter, as in Example 1, a passivation film made of plasma CVD-SiO$_2$ and having a thickness of 1.8 μm was deposited on the resultant structure, thereby manufacturing a MOS semiconductor device.

Since the surface of the wiring layer of a semiconductor device manufactured by the above method was covered with the niobium nitride layer, the surface of the wiring layer was prevented from oxidation in a step of depositing the passivation film, and the passivation film tightly contacted with the wiring layer. In addition, since the niobium thin layer was left under the wiring layer, the wiring layer tightly contacted with the BPSG film serving as an insulating interlayer.

The same acceleration test as in Example 1 was performed to the wiring layer of the manufactured semiconductor device, and a disconnection time of the wiring layer due to electromigration was measured. As a result, after about 100 hours from when the acceleration test was started, disconnections were detected in 50% of the wiring layer 18. Therefore, it was confirmed that the semiconductor device had an excellent electromigration resistance.

When the total resistance of the remaining niobium thin layer and the wiring layer was measured, the resistance was 48 mΩ/□. It was confirmed that the resistance could be reduced compared with the resistance (55 mΩ/□) of the stacked layer pattern 15 which was not heat-treated. That is, when the resistance was converted into a specific resistance, the specific resistance could be reduced from 2.2 Ωμcm to 1.9 Ωμcm.

Note that the above embodiment exemplifies the manufacture of a MOS semiconductor device. However, this embodiment can be applied to a bipolar semiconductor device.

As described above, according to the present invention, there is provided a highly reliable high-speed semiconductor device including a wiring layer having a specific resistance lower than the specific resistance (3 μΩcm) of an Al-Si-Cu alloy and in which electromigration resistance is improved, oxidation resistance is excellent, and an adhesion strength with an insulating interlayer or a passivation film is improved. According to the present invention, a heat treatment in a nitrogen atmosphere for forming the wiring layer can be performed at a temperature sufficiently lower than 800° C. at which an impurity diffusion layer formed on a semiconductor substrate in advance may be diffused deeper again, thereby providing a method of easily manufacturing a highly reliable high-speed semiconductor device suitable for shallowing.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept a defined by the appended claims and their equivalents.

What is claimed is:

1. A method for manufacturing a semiconductor device, comprising the steps of:
   forming an element on a semiconductor substrate;
   depositing an insulating interlayer on said semiconductor substrate;
   sequentially depositing a thin layer made of a metal not forming an intermetallic compound with copper and a copper layer on said insulating interlayer to form a stacked layer;
   patterning said stacked layer; and
   forming a wiring layer having a structure in which said patterned stacked layer is heat-treated in a nitrogen containing atmosphere to diffuse a metal of said metal thin layer to a peripheral surface of a copper layer through said copper layer, said diffused metal is nitrided to cover a surface of the copper layer in a crystal state with a nitride of a metal not forming an intermetallic compound with copper, and said metal and/or said metal nitride is present at grain boundaries of the copper layer.

2. The method according to claim 1, wherein said metal thin layer is made of at least any one metal selected from a group consisting of vanadium, niobium, tantalum, chromium, molybdenum, and tungsten.

3. The method according to claim 1, wherein after said metal is diffused in said copper layer from said metal thin layer in said heat treatment, the metal thin layer is left under said wiring layer.

4. The method according to claim 2, wherein said metal thin layer is made of chromium, and said heat treatment is performed at a temperature of 600 to 800° C.

5. The method according to claim 2, wherein said metal thin layer is made of niobium, and said heat treatment is performed at a temperature of 600 to 800° C.

6. The method according to claim 1, wherein said heat treatment in the nitrogen atmosphere is plasma nitriding.

7. The method according to claim 1, wherein before said heat treatment in the nitrogen containing atmosphere is performed, a heat treatment is performed in an inert gas.

* * * * *